(12) United States Patent
Yang et al.

(10) Patent No.: US 11,784,293 B2
(45) Date of Patent: Oct. 10, 2023

(54) DISPLAY PANEL AND TILED DISPLAY

(71) Applicant: AU Optronics Corporation, Hsin-Chu (TW)

(72) Inventors: Wen-Wei Yang, Hsin-Chu (TW); Cheng-Yeh Tsai, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 267 days.

(21) Appl. No.: 17/242,539

(22) Filed: Apr. 28, 2021

(65) Prior Publication Data
US 2021/0384392 A1    Dec. 9, 2021

Related U.S. Application Data

(60) Provisional application No. 63/035,056, filed on Jun. 5, 2020.

(30) Foreign Application Priority Data

Dec. 30, 2020  (TW) .................................. 109146953

(51) Int. Cl.
*H01L 33/60*   (2010.01)
*H01L 33/44*   (2010.01)
(Continued)

(52) U.S. Cl.
CPC .......... *H01L 33/60* (2013.01); *H01L 23/5387* (2013.01); *H01L 25/13* (2013.01); *H01L 25/167* (2013.01); *H01L 27/156* (2013.01); *H01L 33/44* (2013.01); *H01L 33/58* (2013.01); *H01L 33/62* (2013.01)

(58) Field of Classification Search
CPC ... H01L 27/156; H01L 25/13; H01L 23/5387; H01L 33/58; H01L 33/60; H01L 2933/0058; H01L 33/62; H01L 25/167
See application file for complete search history.

(56) References Cited

U.S. PATENT DOCUMENTS

2018/0122836 A1* 5/2018 Kang ...................... H01L 33/54
2019/0181023 A1* 6/2019 Saketi ................. H01L 25/0753
(Continued)

FOREIGN PATENT DOCUMENTS

CN    204577455 U    8/2015
CN    206236704 U    6/2017
(Continued)

*Primary Examiner* — Feifei Yeung Lopez
(74) *Attorney, Agent, or Firm* — WPAT, P.C (57) ABSTRACT

The display panel includes an array substrate, a light emitting diode and a first connection electrode. The array substrate includes a driving circuit layer. The light emitting diode is disposed on the array substrate. The light emitting diode includes a first semiconductor layer, a second semiconductor layer and a light emitting layer. The light emitting layer is disposed between the first semiconductor layer and the second semiconductor layer. The first connection electrode is electrically connected to the driving circuit layer and the first semiconductor layer. The first connection electrode wraps the light emitting layer such that a normal projection of the light emitting layer over the array substrate is within a normal projection of the first connection electrode over the array substrate.

19 Claims, 12 Drawing Sheets

(51) Int. Cl.
*H01L 33/62* (2010.01)
*H01L 25/16* (2023.01)
*H01L 27/15* (2006.01)
*H01L 25/13* (2006.01)
*H01L 23/538* (2006.01)
*H01L 33/58* (2010.01)

(56) References Cited

U.S. PATENT DOCUMENTS

| | | |
|---|---|---|
| 2020/0028046 A1 | 1/2020 | Kim et al. |
| 2020/0337160 A1* | 10/2020 | Hsiao .................. G02F 1/13336 |
| 2021/0265547 A1 | 8/2021 | Kim et al. |

FOREIGN PATENT DOCUMENTS

| | | |
|---|---|---|
| CN | 207097853 U | 3/2018 |
| CN | 110121782 A | 8/2019 |
| CN | 111244242 A | 6/2020 |

* cited by examiner

DISPLAY PANEL AND TILED DISPLAY

CROSS-REFERENCE TO RELATED APPLICATION

This application claims priority to U.S. Provisional Patent Application Ser. No. 63/035,056, filed Jun. 5, 2020, and Taiwan Application Serial Number 109146953, filed Dec. 30, 2020, which are herein incorporated by reference in its entirety.

BACKGROUND

Field of Invention

The present disclosure relates to a display panel and tiled display.

Description of Related Art

Using single light emitting diode (LED) as a pixel unit provides advantages such as high resolution, high brightness and high aspect ratio. A display of micro LEDs can be formed by splicing to achieve a display with large area, even a seamless display, and thus becoming a focused attention of the market. The light emitting diode can connect a driving circuit by a conductive electrode. The conductive electrode has good conductivity and can provide good connection therebetween. However, it would shade the light output of the light emitting diode and lead to reduction of the light output efficiency. Therefore, in the display of light emitting diodes, how to increase the light output efficiency becomes an urgent issue to be solved at present.

SUMMARY

Some embodiments of the present disclosure provide a display panel with good light output efficiency.

Some embodiments of the present disclosure provide a display panel including an array substrate, a light emitting diode and a first connecting electrode. The array substrate has a driving circuit layer. The light emitting diode is disposed on the array substrate. The light emitting diode includes a first semiconductor layer, a second semiconductor layer and a light emitting layer. The light emitting layer is disposed between the first semiconductor layer and the second semiconductor layer. The first connecting electrode is electrically connected to the driving circuit layer and the first semiconductor layer. The first connecting electrode encapsulates the light emitting layer such that a normal projection of the light emitting layer over the array substrate is within a normal projection of the first connecting electrode over the array substrate.

Some embodiments of the present disclosure provide a tiled display including a plurality of display panels. The display panels include a first display panel and a second display panel. The first display panel has a first side connecting a second side of the second display panel. Each of the display panels includes an array substrate, a plurality of light emitting diodes and a plurality of first connecting electrodes. The array substrate has a driving circuit layer. The light emitting diodes are disposed on the array substrate, and each of the light emitting diodes includes a first semiconductor layer, a second semiconductor layer and a light emitting layer. The light emitting layer is disposed between the first semiconductor layer and the second semiconductor layer. The first connecting electrodes are electrically connected to the driving circuit layer and the first semiconductor layer of each of the first light emitting diodes, respectively. Each of the first connecting electrodes encapsulates the light emitting layer of each of the light emitting diodes such that a normal projection of the light emitting layer over the array substrate is within a normal projection of the first connecting electrode over the array substrate. The array substrate of the first display panel has a first lower surface facing away from the light emitting diodes. The array substrate of the second display panel has a second lower surface facing away the light emitting diodes. The first lower surface and the second lower surface form a light output display surface.

Based on above, in the display panel of the present disclosure, the first connecting electrode encapsulates the light emitting layer such that a normal projection of the light emitting layer over the array substrate is within a normal projection of the first connecting electrode over the array substrate. Therefore, the first connecting electrode can shade an upper output light of the light emitting diode efficiently and reflects the upper output light, thereby increasing a brightness of the lower output light and allowing the light emitting diode provide a uniform light field. As a result, the display panel of the present disclosure has good lower light output efficiency. Based on a similar reason, the tiled display of some embodiments of the present disclosure has good lower light output efficiency.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figs. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
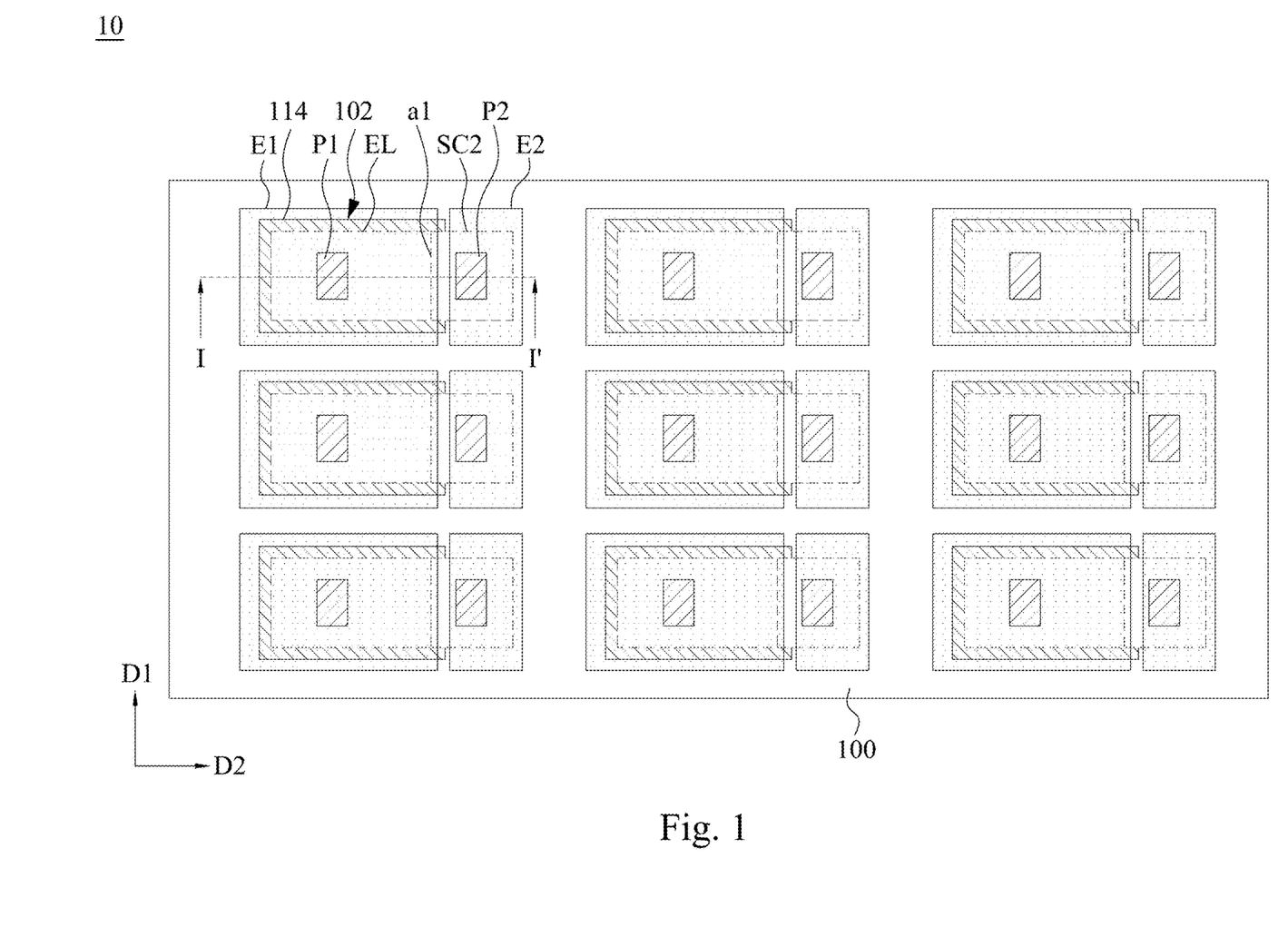
FIG. 1 is a top view of a display panel according to one embodiment of the present disclosure.

FIG. 1 is a top view of a display panel 10 according to one embodiment of the present disclosure. Reference is made to FIG. 1. The display panel 10 includes an array substrate 100 and a light emitting diode (LED) 102. The light emitting diode 102 is disposed on the array substrate 100. In the present embodiment, the light emitting diode 102 may be a micro-LED or a mini-LED. A plurality of light emitting diodes 102 are arranged on the array substrate 100 along a first direction D1 and a second direction D2. The first direction D1 crosses the second direction D2. For example, the first direction D1 is perpendicular to the second direction D2. In the present embodiment, the first direction D1 is a longitudinal direction, and the second direction D2 is a horizontal direction.

Figure 2:
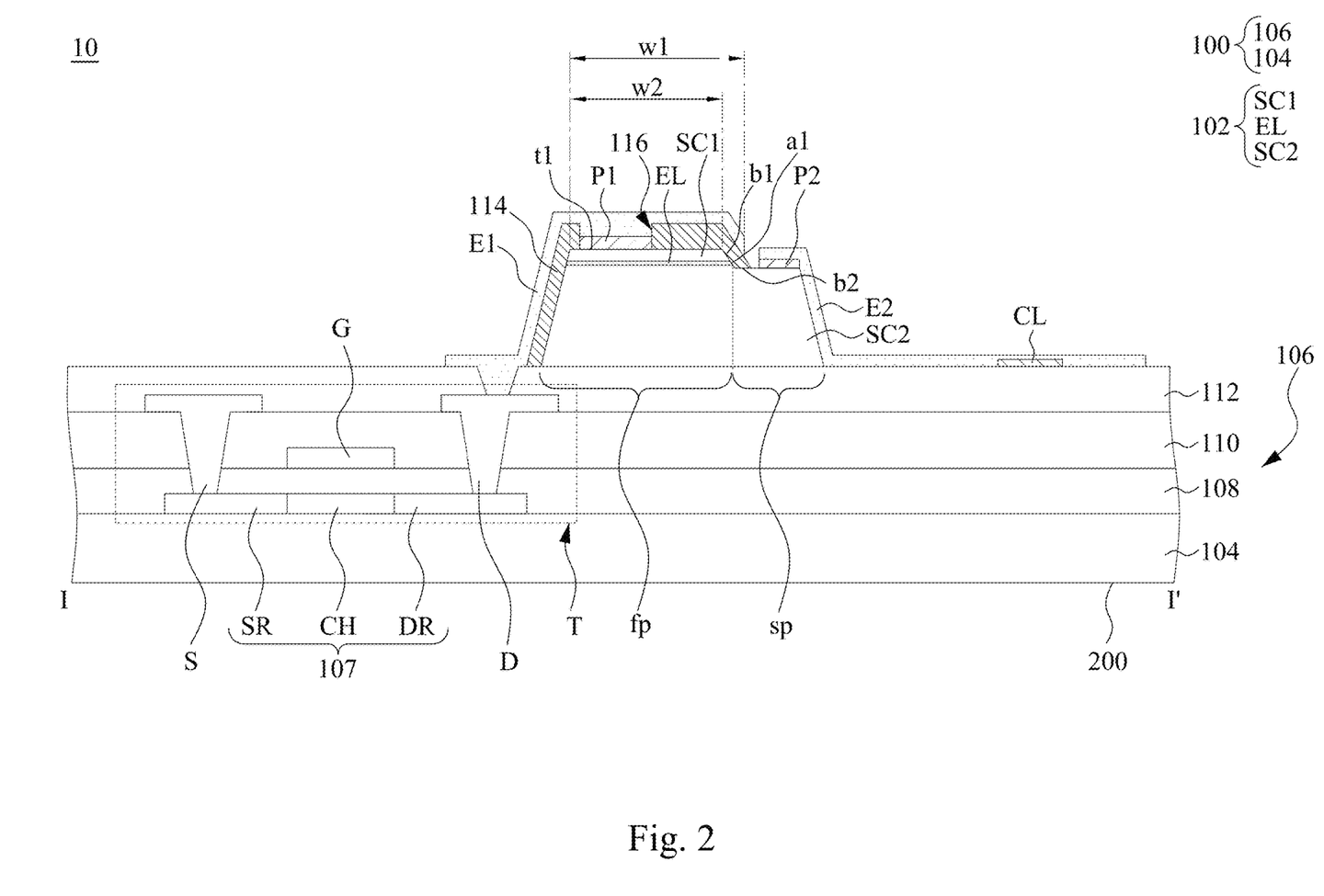
FIG. 2 is a cross-sectional view along line I-I' of FIG. 1.

FIG. 2 is a cross-sectional view along line I-I' of FIG. 1. Reference is made to FIGS. 1 and 2. The array substrate 100 further includes a driving circuit layer 106 and a substrate 104. For example, the substrate 104 is a glass substrate or a substrate of flexible material, such as a plastic substrate. The driving circuit layer 106 is disposed on the substrate 104. For example, the driving circuit layer 106 includes a plurality of transistors T. The transistors T are disposed on the substrate 104.

The transistors T can be low temperature poly-silicon thin film transistors (LTPS-TFT) and include a semiconductor layer 107, a source S, a drain D and a gate G. The semiconductor layer 107 is disposed on the substrate 104. A material of the semiconductor layer 107 is polycrystalline silicon. However, the present disclosure is not limited thereto. In some other embodiments, a material of the semiconductor layer 107 is, for example, amorphous silicon, metal oxide semiconductor or other semiconductor materials.

The driving circuit layer 106 further includes a gate insulating layer 108, an inter-layer dielectric (ILD) layer 110 and an insulating layer 112. The gate insulating layer 108 is disposed between the semiconductor layer 107 and the gate G. For example, in the present embodiment, the gate G of the transistor T is disposed on the semiconductor layer 107 to form a top-gate TFT. However, the present disclosure is not limited thereto. In some other embodiments, the gate G of the transistor T can be disposed under the semiconductor layer 107. That is, the gate G is between the semiconductor layer 107 and the substrate 104 to form a bottom-gate TFT.

In the present embodiment, the semiconductor layer 107 can include a source region SR, a channel region CH and a drain region DR. The gate G overlaps the channel region CH of the semiconductor layer 107. The channel region CH is between the source region SR and the drain region DR. However, the present disclosure is not limited thereto.

The ILD layer 110 covers the gate G. The source S and the drain D pass through the ILD layer 110 and the gate insulating layer 108 to be electrically connected to the source region SR and the drain region DR, respectively. The insulating layer 112 is disposed on the ILD layer 110 to cover the source S and the drain D. In the present embodiment, the materials of the gate insulating layer 108, the ILD layer 110 and the insulating layer 112 can be inorganic materials or organic materials or a combination thereof. The inorganic materials may be, for example, silicon oxide, silicon nitride, silicon oxynitride or a stack of layers of at least two materials abovementioned. However, the present disclosure is not limited thereto.

The light emitting diode 102 is disposed on the insulating layer 112. The light emitting diode 102 includes a first semiconductor layer SC1, a second semiconductor layer SC2 and a light emitting layer EL. The light emitting layer EL is disposed between the first semiconductor layer SC1 and the second semiconductor layer SC2. In the present embodiment, the second semiconductor layer SC2, the light emitting layer EL and the first semiconductor layer SC1 are stacked on the insulating layer 112 in sequence. In the present embodiment, the first semiconductor layer SC1 has a mesa structure. For example, the first semiconductor layer SC1 overlaps a first portion fp of the second semiconductor layer SC2. The first semiconductor layer SC1 does not overlap a second portion sp of the second semiconductor layer SC2. The light emitting layer EL is between the first semiconductor layer SC1 and the first portion fp of the second semiconductor layer SC2. In the present embodiment, the first semiconductor layer SC1 is a p-type semiconductor layer. The second semiconductor layer SC2 is an n-type semiconductor layer.

The driving circuit layer 106 of the array substrate 100 further includes a common line CL. One of the first semiconductor layer SC1 and the second semiconductor layer SC2 is electrically connected to the transistor T. Another one of the first semiconductor layer SC1 and the second semiconductor layer SC2 is electrically connected to the common line CL to receive a common voltage. For example, in the present embodiment, the first semiconductor layer SC1 is electrically connected to the transistor T. The second semiconductor layer SC2 is electrically connected to the common line CL.

The display panel 10 further includes a first connecting electrode E1. The first connecting electrode E1 is electrically connected to the driving circuit layer 106 and the first semiconductor layer SC1. For example, the first connecting electrode E1 is electrically connected to the first semiconductor layer SC1 through the first conductive pad P1. The first connecting electrode E1 is electrically connected to the transistor T of the driving circuit layer 106. In the present embodiment, the first connecting electrode E1 passes through the insulating layer 112 to be electrically connected to the transistor T. For example, the first connecting electrode E1 is electrically connected to the drain D of the transistor T. The display panel 10 further includes a second connecting electrode E2. The second connecting electrode E2 is connected to the second semiconductor layer SC2. For example, the second connecting electrode E2 is electrically connected to the second semiconductor layer SC2 through the second conductive pad P2. The second connecting electrode E2 and the first connecting electrode E1 can be formed by patterning the same film layer and thus can have the same material.

In the present embodiment, the display panel 10 further includes a protective layer 114. The first connecting electrode E1 is disposed on the protective layer 114. The protective layer 114 covers a top surface and a sidewall of the light emitting diode 102 and has an opening 116 exposing the first conductive pad P1 such that the first connecting electrode E1 can be electrically connected to the first semiconductor layer SC1 through the first conductive pad P1.

The first connecting electrode E1 encapsulates the light emitting layer EL such that a normal projection of the light emitting layer EL over the array substrate 100 is within a normal projection of the first connecting electrode E1 over the array substrate 100. Therefore, the first connecting electrode E1 can shade an upper output light of the light emitting diode 102 efficiently and reflects the upper output light, thereby increasing a brightness of the lower output light of the light emitting diode 102 and allowing the light emitting diode 102 provide a uniform light field. As a result, the display panel 10 has good lower light output efficiency. In other words, an output display surface 200 of the display panel 10 which faces away from the light emitting diode 102 can be allowed to have good lower light output efficiency. In the present embodiment, the first connecting electrode E1 can include conductive materials of opaque materials, such as metals, alloys or a combination thereof.

The light emitting layer EL has a connecting surface a1 connecting between a sidewall 131 of the first semiconductor layer SC1 and an upper surface b2 of the second semiconductor layer SC2. The protective layer 114 is disposed on the connecting surface a1. For example, the protective layer 114 extends form a top surface t1 of the first semiconductor layer SC1 to cover a sidewall 131 of the first semiconductor layer SC1 and the connecting surface a1 of the light emitting layer EL. That is, the protective layer 114 encapsulates the first semiconductor layer SC1 and exposes the first conductive pad P1. For example, the protective layer 114 extends from the top surface t1 of the first semiconductor layer SC1 to cover each side (e.g., the sidewall 131) of the first semiconductor layer SC1, respectively. The protective layer 114 encapsulates the light emitting layer EL. For example, the protective layer 114 extends from each side (e.g., the sidewall 131) of the first semiconductor layer SC1 to cover each side (e.g., the connecting surface a1) of the light emitting layer EL. Therefore, the protective layer 114 can prevent the first connecting electrode E1 from conducting the second semiconductor layer SC2. Therefore, the protective layer 114 can prevent the first connecting electrode E1 from conducting the second semiconductor layer SC2. The material of the protective layer 114 is an insulating material. In the present embodiment, the first connecting electrode E1 is over the connecting surface a1 and thus can shade and reflect the upper output light of the light emitting diode 102 which outputs toward the first connecting electrode E1 over the connecting surface a1. Therefore, the brightness of the lower output light of the light emitting diode 102 is increased. And the light emitting diode 102 is allowed to provide a uniform light field. In the present embodiment, the protective layer 114 extends from the connecting surface a1 to cover a part of the upper surface b2 of the second semiconductor layer SC2.

In the present embodiment, a normal projection of the first connecting electrode E1 over the second semiconductor layer SC2 has a width w1 greater and equal to a width w2 of the top surface t1 of the first semiconductor layer SC1, and hence can shade and reflect the upper output light of the light emitting diode 102 efficiently, thereby increasing the brightness of the lower output light of the light emitting diode 102 and allowing the light emitting diode 102 provide a uniform light field.

Figure 3:
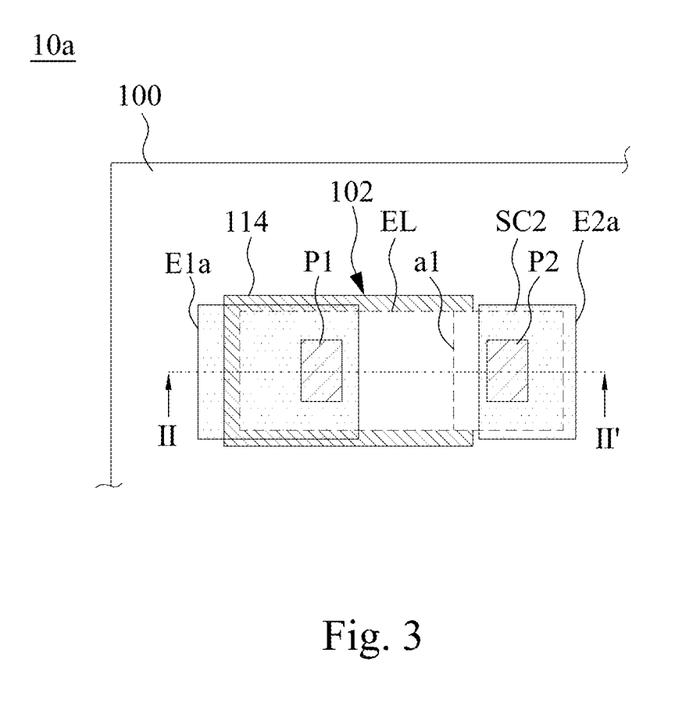
FIG. 3 is a partial top view of a display panel of a control group.
Figure 4:
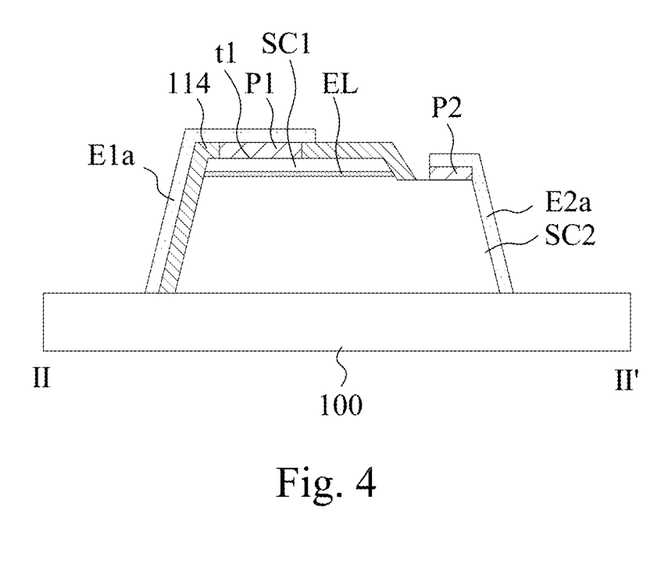
FIG. 4 is a cross-sectional view along line II-II' of FIG. 3.
Figure 5:
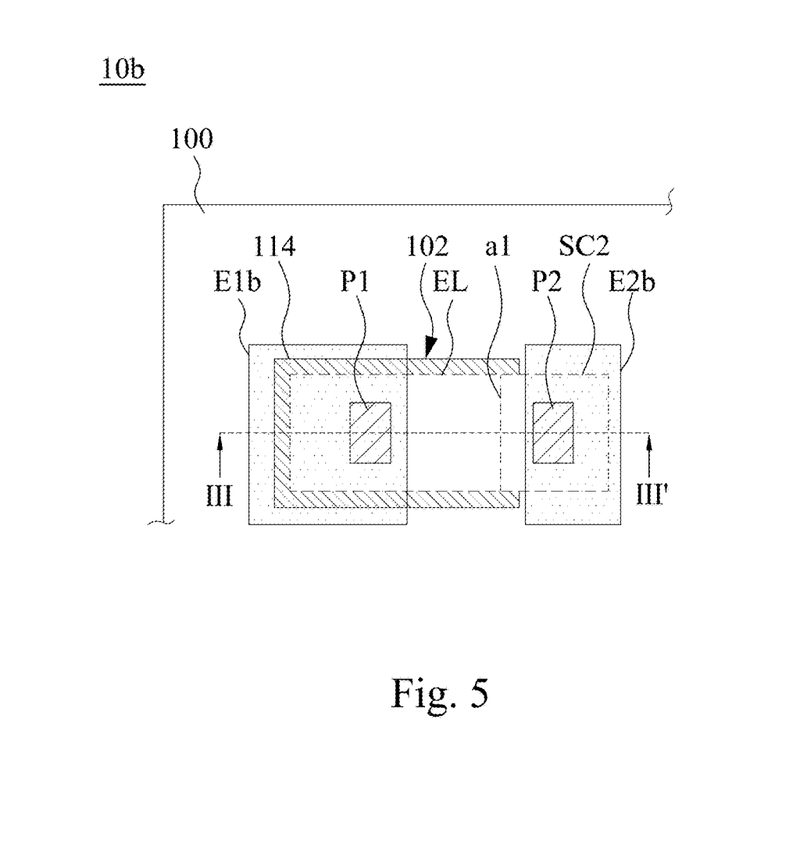
FIG. 5 is a partial top view of a display panel of a control group.
Figure 6:
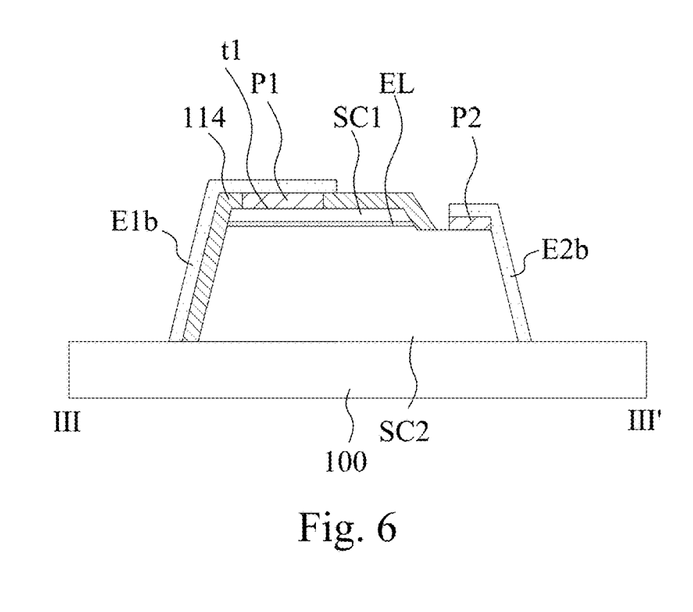
FIG. 6 is a cross-sectional view along line III-III' of FIG. 5.
Figure 7:
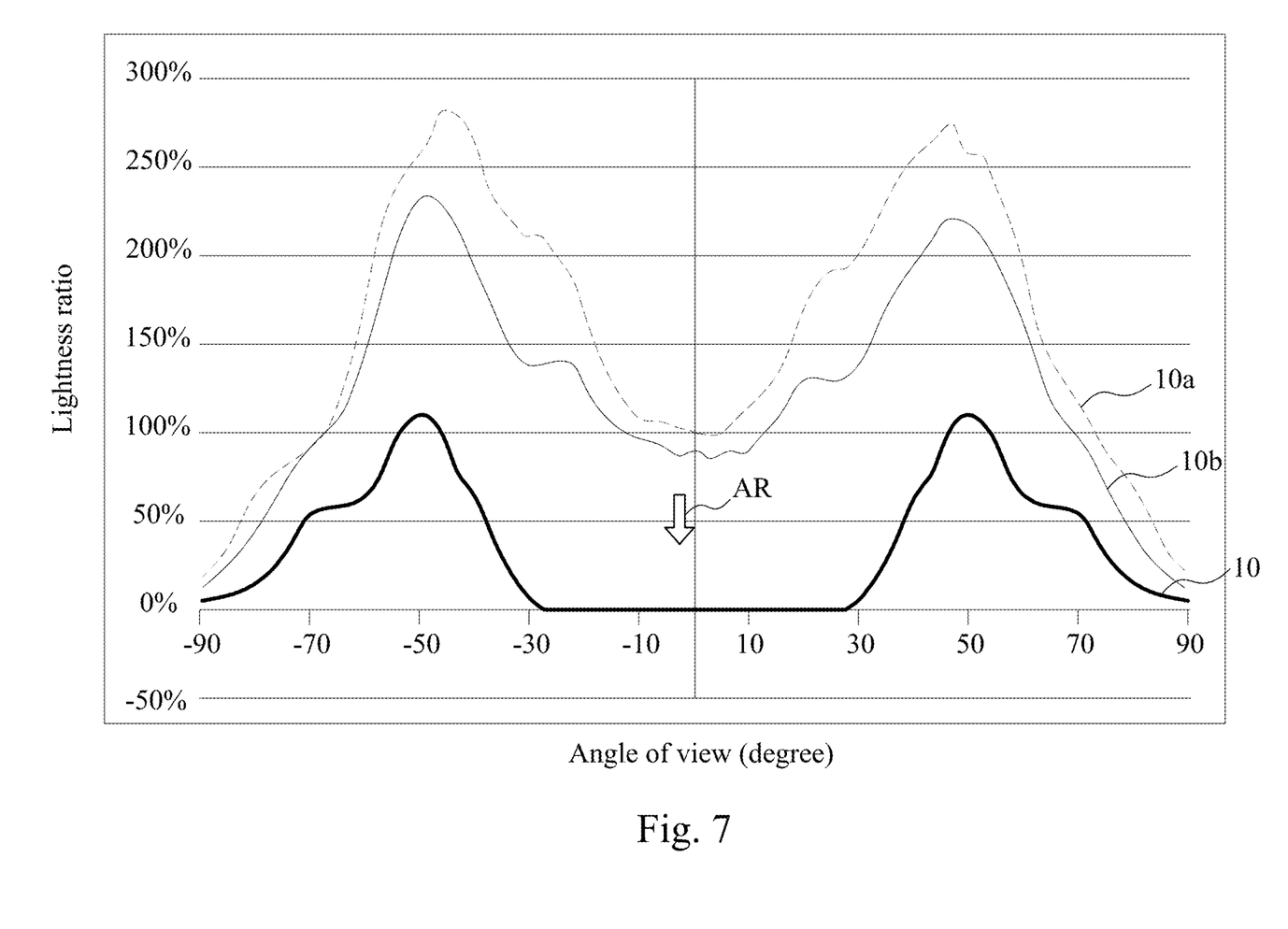
FIG. 7 is a diagram of brightness of upper output lights of the display panel according to one embodiment of the present disclosure and the display panels of the control groups.
Figure 8:
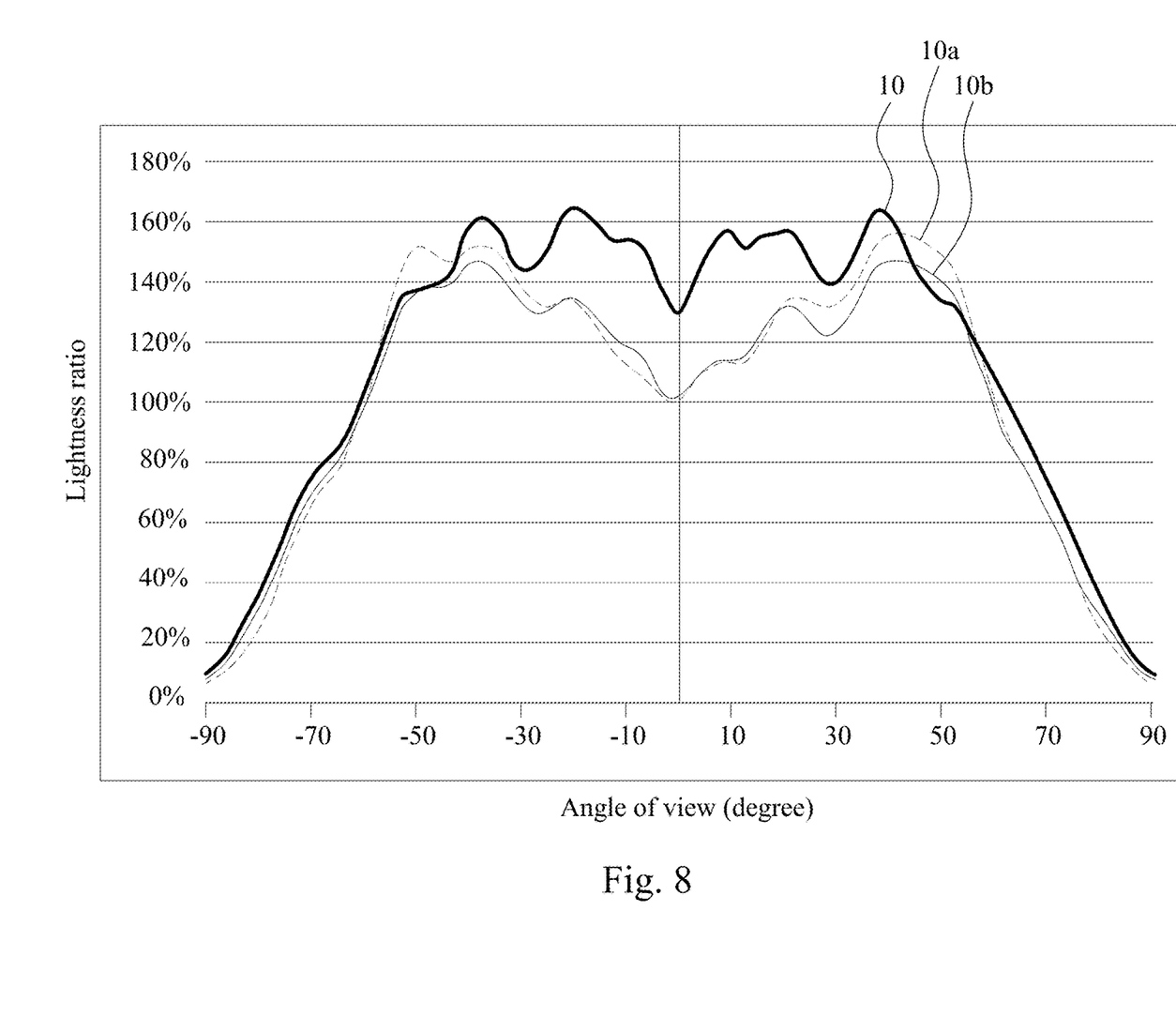
FIG. 8 is a diagram of brightness of lower output lights of the display panel according to one embodiment of the present disclosure and the display panels of the control groups.
Figure 9:
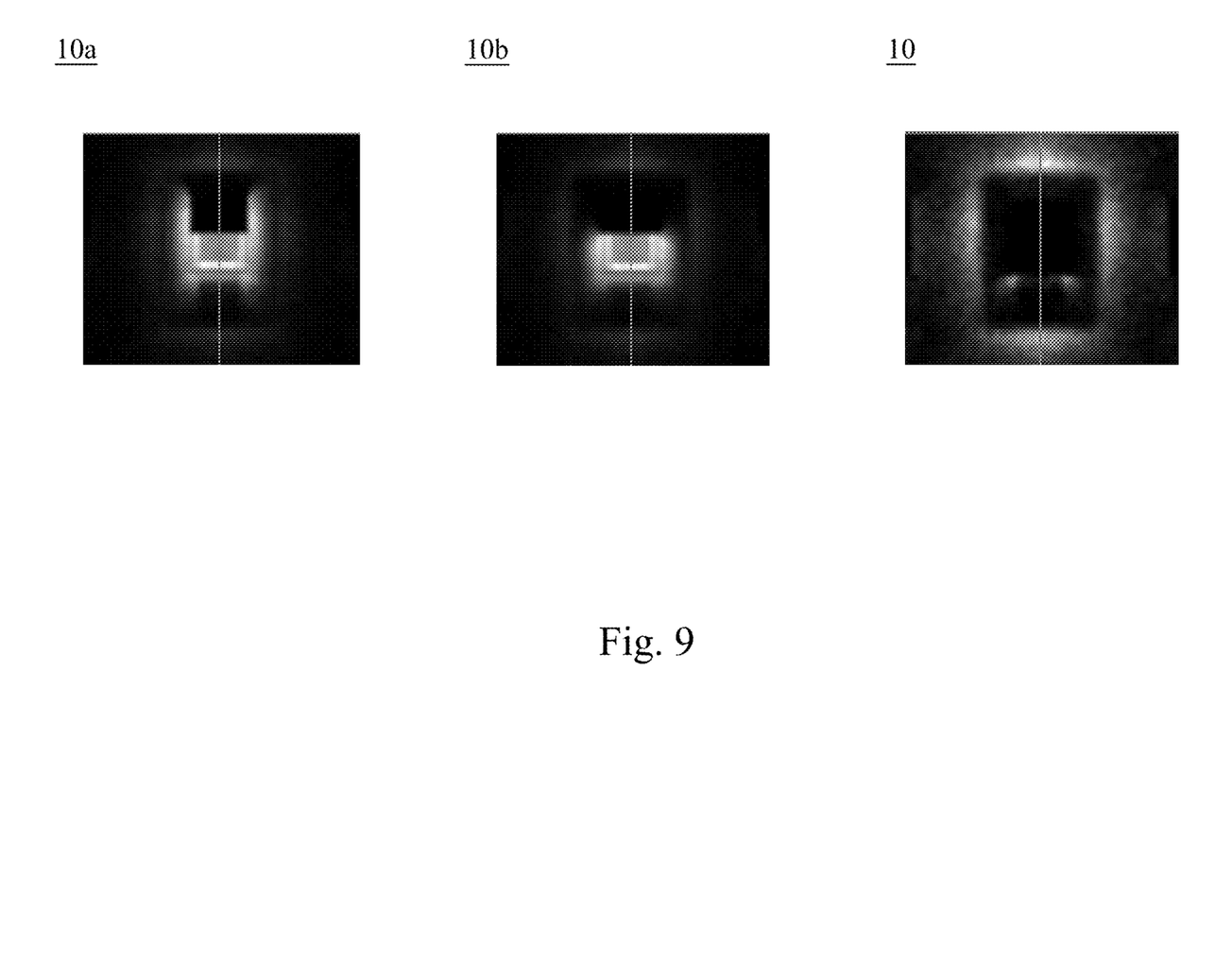
FIG. 9 is a diagram of partial light field of the display panel according to one embodiment of the present disclosure and the display panels of the control groups.

In the following, the brightness of the upper output light, the brightness of the lower output light and the light field of the display panel 10 according to one embodiment of the present disclosure and a display panel 10a and a display panel 10b of control groups will be discussed. FIG. 3 is a partial top view of a display panel 10a of a control group. FIG. 4 is a cross-sectional view along line II-II' of FIG. 3. FIG. 5 is a partial top view of a display panel 10b of a control group. FIG. 6 is a cross-sectional view along line III-III' of FIG. 5. FIG. 7 is a diagram of brightness of upper output lights of the display panel 10 according to one embodiment of the present disclosure and the display panels 10a, 10b of the control groups. The longitudinal axis represents lightness ratios. The horizontal axis represents angles of view. FIG. 8 is a diagram of brightness of lower output lights of the display panel 10 according to one embodiment of the present disclosure and the display panels 10a, 10b of the control groups. The longitudinal axis represents lightness ratios. The horizontal axis represents angles of view. FIG. 9 is a diagram of partial light field of the display panel 10 according to one embodiment of the present disclosure and the display panels 10a, 10b of the control groups (that is, the light emitting diode 102 is observed by a microscope after it turns on).

Reference is made to FIG. 3 and FIG. 4. The first connecting electrode E1a of the control group does not cover opposite sidewalls of the first semiconductor layer SC1 of the light emitting diode 102. In other words, the first connecting electrode E1a does not encapsulate the light emitting layer EL of the light emitting diode 102 such that a normal projection of the light emitting layer EL over the array substrate 100 is not within a normal projection of the first connecting electrode E1a over the array substrate 100. Reference is made to FIG. 5 and FIG. 6. The first connecting electrode E1b of the control group merely partially covers opposite sidewalls of the first semiconductor layer SC1 of the light emitting diode 102. Also, a normal projection of the light emitting layer EL over the array substrate 100 is not within a normal projection of the first connecting electrode E1b over the array substrate 100. Compared to the display panels 10a, 10b of the control groups, the first connecting electrode E1 of the light emitting diode 102 extends from the top surface t1 of the first semiconductor layer SC1 to cover the sidewall 131 of the first semiconductor layer SC1. As mentioned above, the first connecting electrode E1 encapsulates the light emitting layer EL such that the normal projection of the light emitting layer EL over the array substrate 100 is within the normal projection of the first connecting electrode E1 over the array substrate 100.

Thereafter, referring to FIG. 7, the brightness of the upper output light of the display panel 10 is almost equals to zero, which is much less than the brightness of the upper output lights of the display panels 10a, 10b of the control groups (as shown by an arrow AR). In can be approved that the first connecting electrode E1 almost shades the upper output light of the light emitting diode 102. Thereafter, referring to FIG. 8, the brightness of the lower output light of the display panel 10 according to one embodiment of the present disclosure is increased by 30% as compared to the display panel 10a of the control group and is increased by 27% as compared to the display panel 10b of the control group. Thereafter, referring to FIG. 9, the photos from left to right correspond to the display panel 10a of the control group, the display panel 10b of the control group and the display panel 10 according to one embodiment of the present disclosure, respectively. The display panels 10a, 10b of the control groups have serious light leakage. The light field of the display panel 10 according to one embodiment of the present disclosure is more uniform as compared to the display panels 10a, 10b of the control groups.

Figure 10:
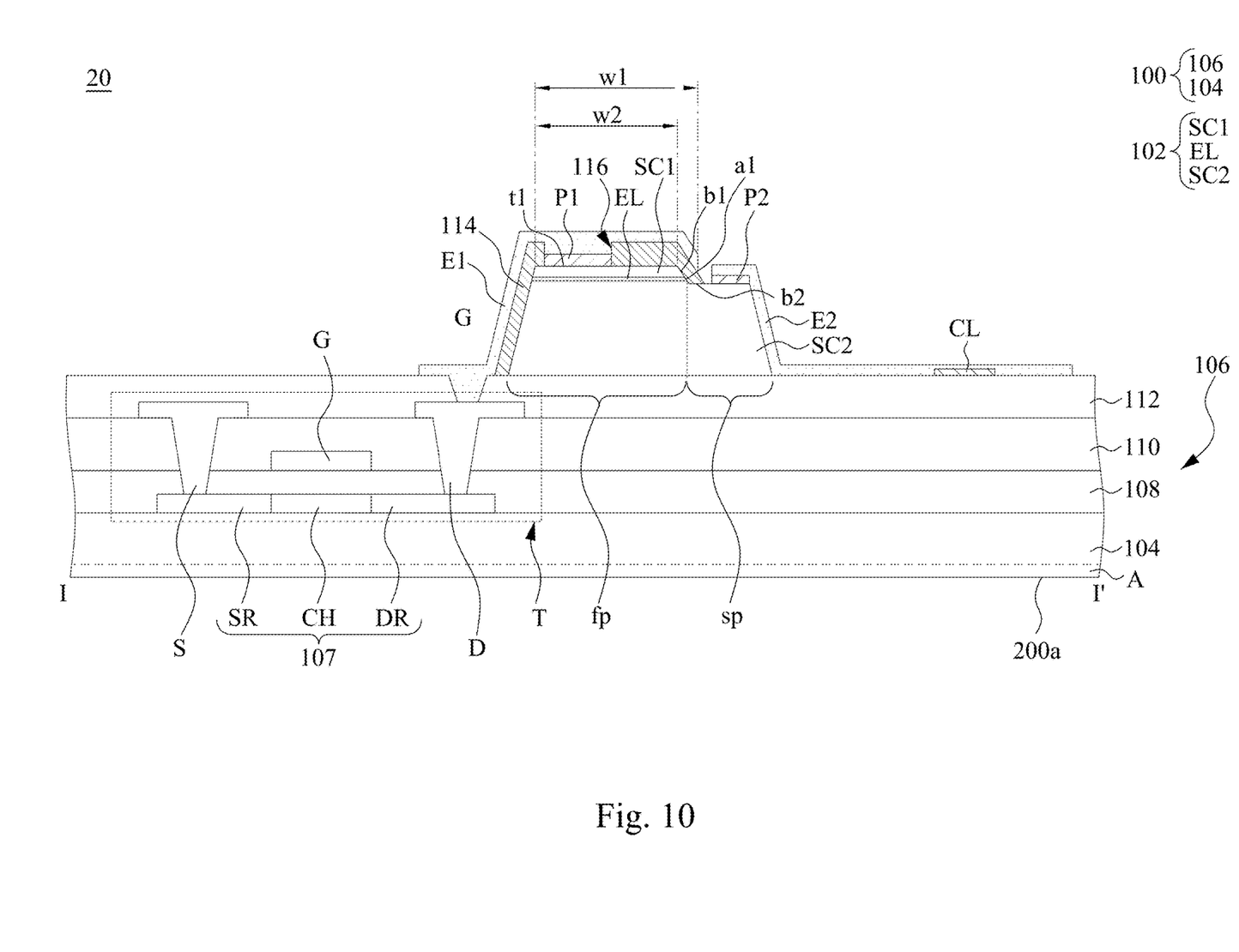
FIG. 10 is a cross-sectional view of a display panel according to another embodiment of the present disclosure.

FIG. 10 is a cross-sectional view of a display panel 20 according to another embodiment of the present disclosure. The main difference between the display panel 20 in FIG. 10 and the display panel 10 in FIG. 2 is that the display panel 20 has a rough surface facing away from the light emitting diode 102. That is, the display panel 20 has an output display surface 200a facing away from the light emitting diode 102. The output display surface 200a has a rough structure A. In condition where the substrate 104 has a refractive index greater than that of air, for example, in some embodiments where the substrate 104 is glass, the refractive index of the substrate 104 equals to 1.5, and the refractive index of air is 1. This rough surface can prevent too much light having total internal reflection at an interface between the substrate 104 and air and thus cannot output, thereby increasing the light output efficiency and the angle of view of the display panel 20.

Figure 11:
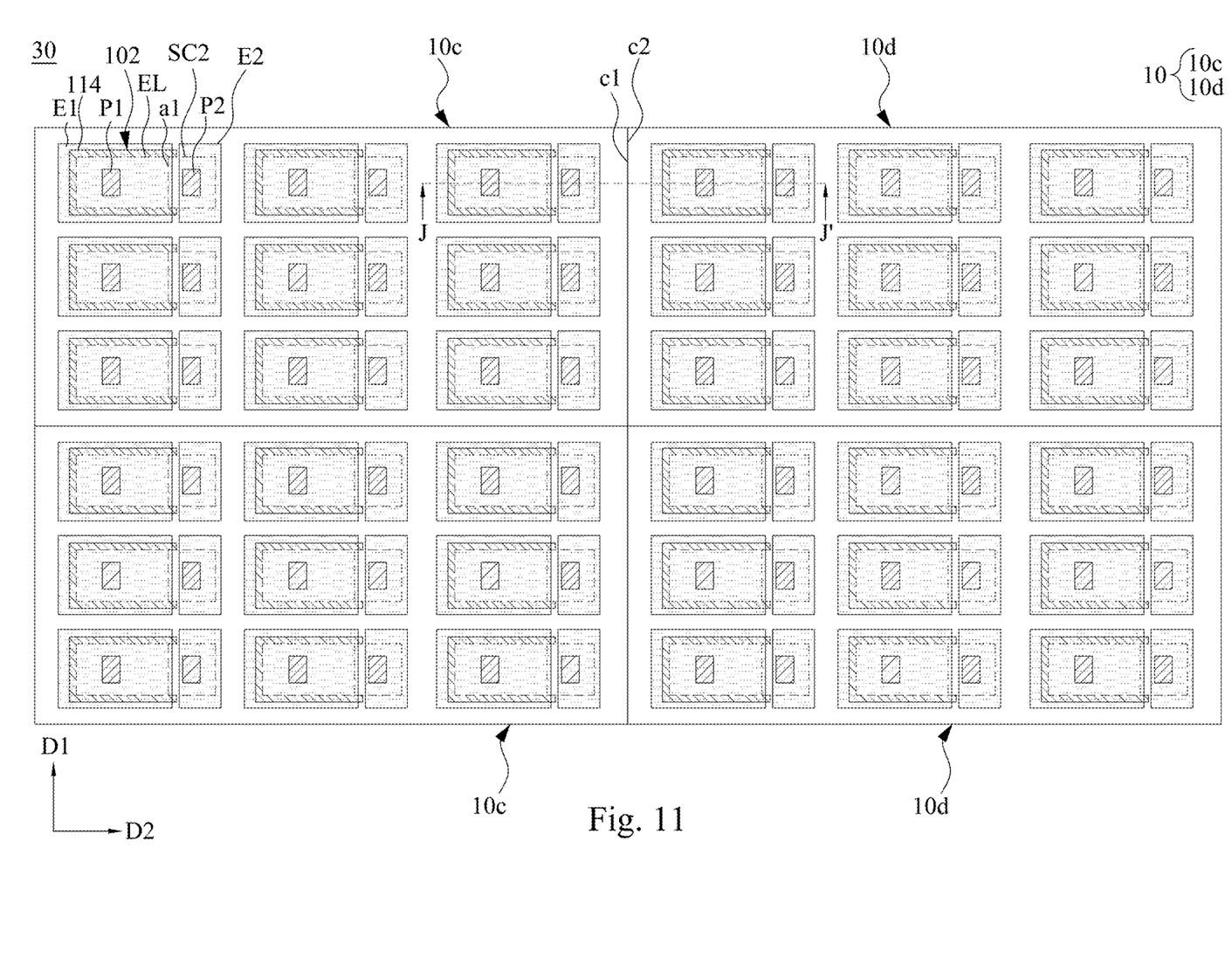
FIG. 11 is a top view of a tiled display according to one embodiment of the present disclosure.

FIG. 11 is a top view of a tiled display 30 in accordance of one embodiment of the present disclosure. Referring to FIG. 11, the tiled display 30 includes a plurality of display panels 10. For example, the display panels 10 include a first display panel 10c and a second display panel 10d. The first display panel 10c has a first side c1 connected to a second side c2 of the second display panel 10d. Although the tiled display 30 according to the present embodiment is shown as including only two first display panels 10c and two second display panels 10d, the present disclosure is not limited thereto. The tiled display 30 can include first display panels 10c and second display panels 10d of other numbers.

Figure 12:
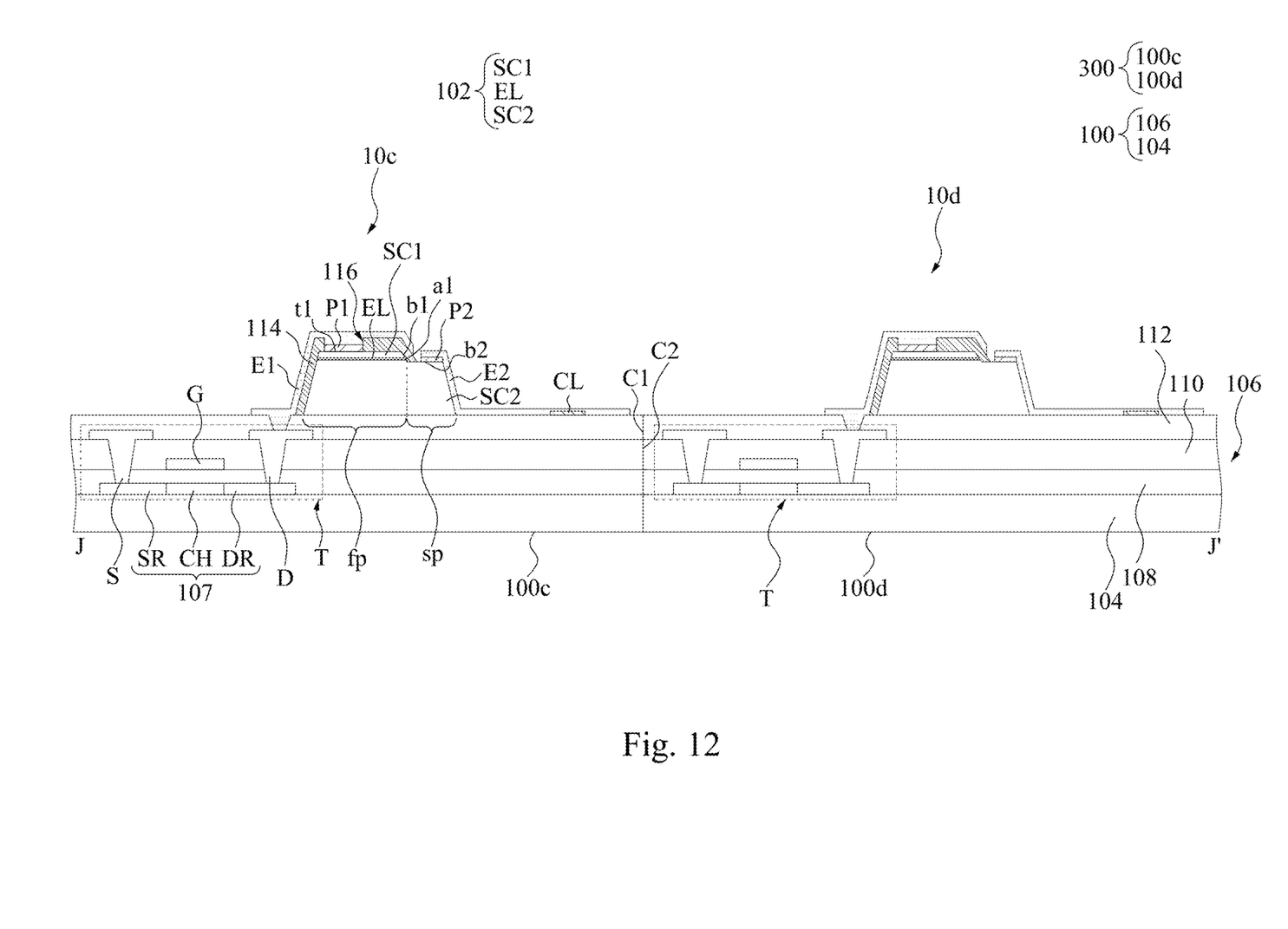
FIG. 12 is a cross-sectional view along line J-J' of FIG. 11.

FIG. 12 is a cross-sectional view along line J-J' in FIG. 11. Referring to FIGS. 11 and 12, in the present embodiment, each of the display panels 10 (e.g., the first display panel 10c, the second display panel 10d) includes an array substrate 100, a plurality of light emitting diodes 102 and a plurality of first connecting electrodes E1. The array substrate 100 has a substrate 104 and a driving circuit layer 106. The driving circuit layer 106 is disposed on the substrate 104. The light emitting diode 102 is disposed on the array substrate 100. Each of the light emitting diodes 102 includes a first semiconductor layer SC1, a second semiconductor layer SC2 and a light emitting layer EL. The light emitting layer EL is disposed between the first semiconductor layer SC1 and the second semiconductor layer SC2. The first connecting electrodes E1 are electrically connected to the driving circuit layer 106 and the first semiconductor layer SC1 of each of the light emitting diodes 102, respectively.

For example, the driving circuit layer 106 includes a transistor T and a common line CL. The first connecting electrodes E1 are electrically connected to the drain D of the transistor T and the first semiconductor layer SC1 of each of the light emitting diodes 102, respectively. Each of the display panels 10 (e.g., the first display panel 10c, the second display panel 10d) further includes a second connecting electrode E2. The second connecting electrode E2 is electrically connected to the common line CL and the second semiconductor layer SC2 such that the second semiconductor layer SC2 can receive common voltage.

The array substrate 100 of the first display panel 10c has a first lower surface 100c facing away from the light emitting diode 102. The array substrate 100 of the second display panel 10d has a second lower surface 100d facing away from the light emitting diode 102. The first lower surface 100c and the second lower surface 100d form a light output display surface 300.

Each of the first connecting electrodes E1 encapsulates the light emitting layer EL of each of the light emitting diodes 102 such that a normal projection of the light emitting layer EL over the array substrate 100 is within a normal projection of the first connecting electrode E1 over the array substrate 100. As mentioned above, such configuration allows the first connecting electrodes E1 shade the upper output light of each of the light emitting diodes 102 and reflect this upper output light, thereby increasing a brightness of the lower output light of the light emitting diode 102 and allows the light emitting diode 102 provide uniform light field. Therefore, the tiled display 30 has good lower light output efficiency. In other words, the light output display surface 300 formed by the first lower surface 100c and the second lower surface 100d has good lower light output efficiency.

In the present embodiment, the first side c1 of the first display panel 10c and the second side c2 of the second display panel 10d have complementary shapes. In this way, the first display panel 10c and the second display panel 10d can be pieced together to form a tiled display with a large area and seamlessly pieced. Other elements of the first display panel 10c and the second display panel 10d are similar to the display panel 10 in FIG. 2 and thus are not repeated herein.

Figure 13:
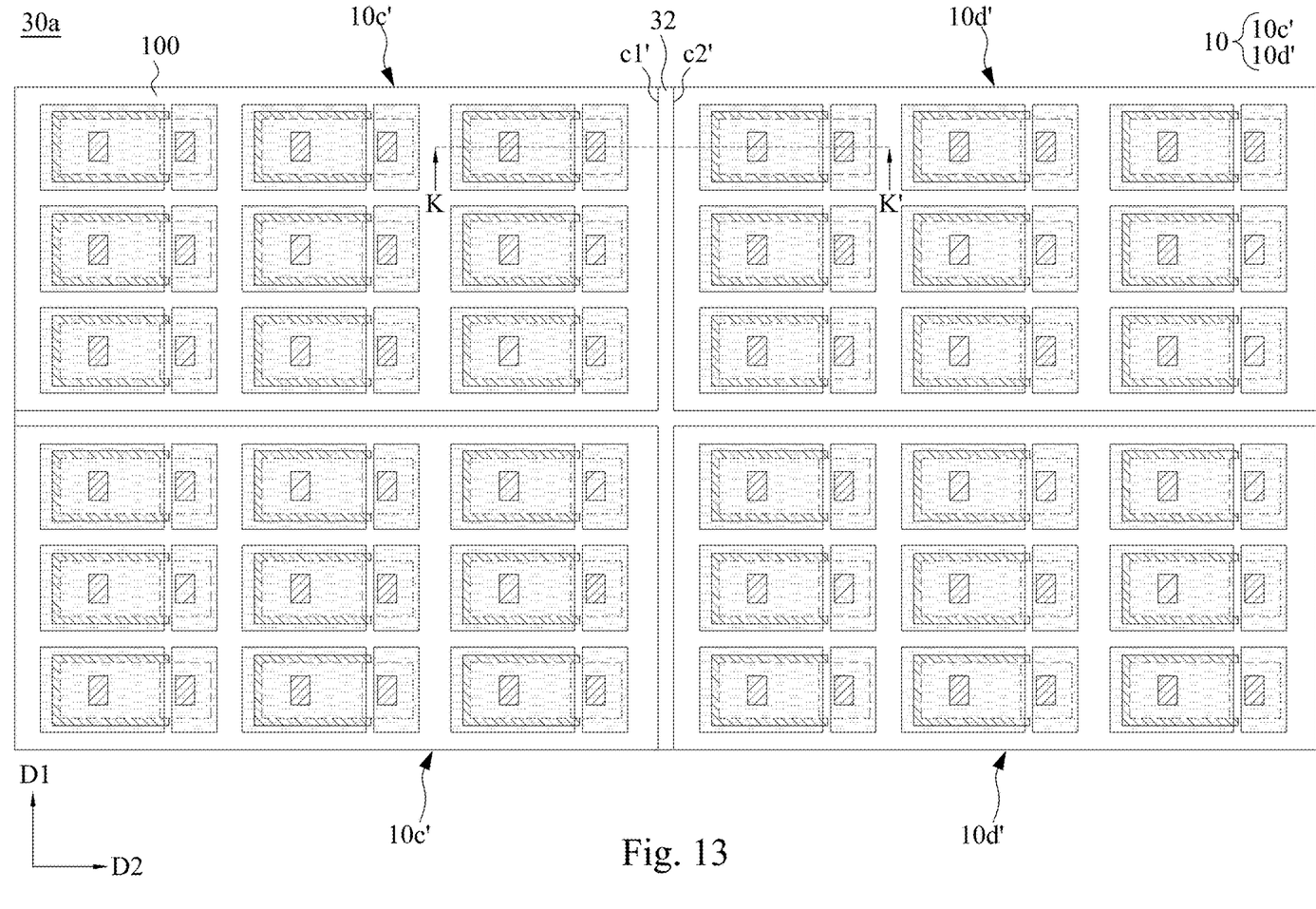
FIG. 13 is a top view of a tiled display according to another embodiment of the present disclosure.
Figure 14:
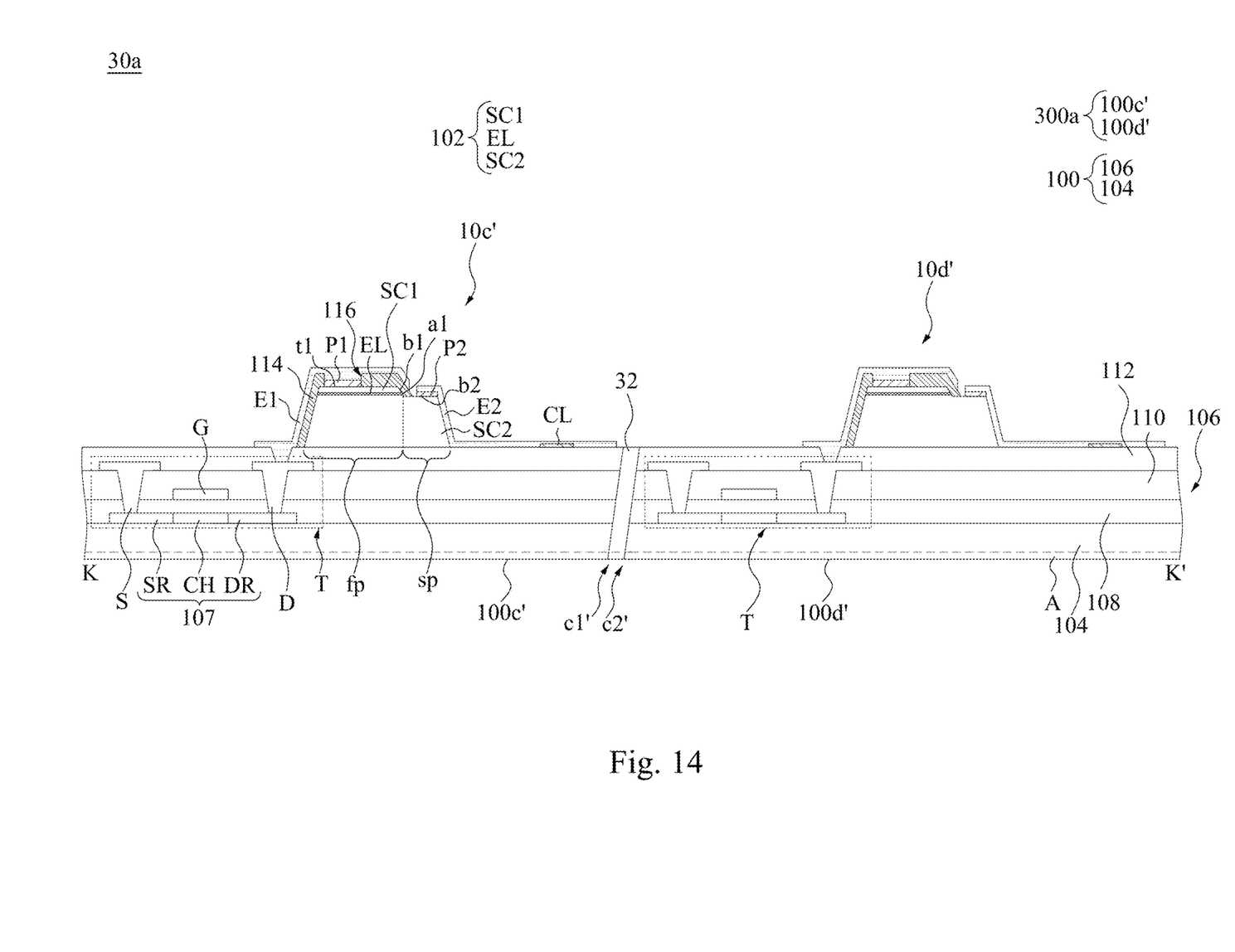
FIG. 14 is a cross-sectional view along line K-K' of FIG. 13.

FIG. 13 is a top view of a tiled display 30a in accordance with another embodiment of the present disclosure. FIG. 14 is a cross-sectional view along K-K' line of FIG. 13. The main difference between the tiled display 30a in FIG. 13 and the tiled display 30 in FIG. 11 is that the tiled display 30a further includes an optical device 32. The optical device 32 is between the first side c1' of the first display panel 10c' and the second side c2' of the second display panel 10d'. For example, the optical device 32 is disposed between an inclined surface of the first side c1' and an inclined surface of the second side c2', thereby further shading the upper output light of the first display panel 10c' and the second display panel 10d' to prevent light leakage problems. In one embodiment, the optical device 32 is a light shading layer. For example, the light shading layer can be formed by any material having shading property, such as black matrix, metal and/or alloy, light absorbing materials or dark organic materials.

The light output display surface 300a has a rough structure A. That is, the first lower surface 100c' of the first display panel 10c' and the second lower surface 100d' of the second display panel 10d' have a rough structure A. In condition where the substrate 104 has a refractive index greater than that of air, for example, in some embodiments where the substrate 104 is glass, the refractive index of the substrate 104 equals to 1.5, and the refractive index of air is 1. This rough structure A can prevent too much light having total internal reflection at an interface between the substrate 104 and air and thus cannot output, thereby increasing the light output efficiency and the angle of view of the tiled display 30a. In some other embodiments, the light output display surface 300a does not have the rough structure A.

Based on above, in the display panel according to one embodiment of the present disclosure, the first connecting electrode encapsulates the light emitting layer such that the normal projection of the light emitting layer over the array substrate is within the normal projection of the first connecting electrode over the array substrate. Therefore, the first connecting electrode can shade the upper output light of the light emitting diode and reflect this upper output light, thereby increasing the brightness of the lower output light of the light emitting diode and allowing the light emitting diode provide uniform light field. Therefore, the display panel in accordance of one embodiment of the present disclosure has good lower output light efficiency. Based on a similar reason, the tiled display in accordance of one embodiment of the present disclosure has good lower output light efficiency.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel, comprising:
   an array substrate having a driving circuit layer;
   a light emitting diode disposed on the array substrate, the light emitting diode comprising:
      a first semiconductor layer;
      a second semiconductor layer having a plurality of sides and an upper surface, wherein the sides surround the upper surface; and
      a light emitting layer disposed between the first semiconductor layer and the second semiconductor layer;
   a first connecting electrode electrically connected to the driving circuit layer and the first semiconductor layer, wherein the first connecting electrode encapsulates the light emitting layer such that a normal projection of the light emitting layer over the array substrate is within a normal projection of the first connecting electrode over the array substrate;
   a second connecting electrode connecting the second semiconductor layer and extending from the upper surface to three of the sides of the second semiconductor layer along the upper surface and the three of the sides, wherein the second connecting electrode covers the three of the sides of the second semiconductor layer and does not cover one of the sides of the second semiconductor layer which the first connecting electrode covers completely;
   wherein two of the sides of the second semiconductor layer are positioned opposite to each other and covered by the first connecting electrode and the second connecting electrode apiece,
   wherein the normal projection of the first connecting electrode over the array substrate does not overlap any normal projection of the second connecting electrode over the array substrate.

2. The display panel of claim 1, wherein the first connecting electrode extends from a top surface of the first semiconductor layer to cover a sidewall of the first semiconductor layer.

3. The display panel of claim 1, wherein the array substrate has a light output display surface facing away from the light emitting diode, and the light output display surface has a rough structure.

4. The display panel of claim 1, further comprising:
   a protective layer, wherein the first connecting electrode is disposed on the protective layer.

5. The display panel of claim 2, further comprising:
   a protective layer, wherein the light emitting layer has a connecting surface connecting between the sidewall of the first semiconductor layer and the upper surface of the second semiconductor layer, and the protective layer is disposed on the connecting surface.

6. The display panel of claim 5, wherein the protective layer extends from the top surface of the first semiconductor layer to cover the sidewall of the first semiconductor layer and the connecting surface.

7. The display panel of claim 5, wherein the first connecting electrode is on the connecting surface.

8. The display panel of claim 5, wherein a normal projection of the first connecting electrode over the upper surface of the second semiconductor layer has a width greater than and equal to a width of the top surface of the first semiconductor layer.

9. The display panel of claim 1, wherein the driving circuit layer further comprises a transistor and a common line, one of the first semiconductor layer and the second semiconductor layer is electrically connected to the transistor, another one of the first semiconductor layer and the second semiconductor layer is electrically connected to the common line.

10. A tiled display, comprises:
    a plurality of display panels, wherein the display panels comprise a first display panel and a second display panel, the first display panel has a first side connecting a second side of the second display panel, each of the display panels comprises:
       an array substrate having a driving circuit layer;
       a plurality of light emitting diodes disposed on the array substrate, and each of the light emitting diodes comprises:
          a first semiconductor layer;
          a second semiconductor layer having a plurality of third sides and a upper surface, wherein the third sides surround the upper surface; and
          a light emitting layer disposed between the first semiconductor layer and the second semiconductor layer;
    a plurality of first connecting electrodes electrically connected to the driving circuit layer and the first semiconductor layer of each of the light emitting diodes, respectively, wherein each of the first connecting electrodes encapsulates the light emitting layer of each of the light emitting diodes such that a normal projection of the light emitting layer over the array substrate is within a normal projection of the first connecting electrode over the array substrate,
    a second connecting electrode connecting electrode connecting the second semiconductor layer and extending from the upper surface to three of the third sides of the second semiconductor layer along the upper surface and the three of the third sides, wherein the second connecting electrode covers the three of the third sides of the second semiconductor layer and does not cover one of the third sides of the second semiconductor layer which one of the first connecting electrodes covers completely, wherein two of the third sides of the second semiconductor layer are positioned opposite to each other and covered by the first connecting electrode and the second connecting electrode apiece, wherein the normal projection of each of the first connecting electrodes over the array substrate does not overlap any normal projection of the second connecting electrode over the array substrate, wherein, the array substrate of the first display panel has a first lower surface facing away from the light emitting diodes, the array substrate of the second display panel has a second lower surface facing away from the light emitting diodes, and the first lower surface and the second lower surface form a light output display surface.

11. The tiled display of claim 10, wherein the first side of the first display panel and the second side of the second display panel have complementary shapes.

12. The tiled display of claim 10, further comprising:
an optical device between the first side of the first display panel and the second side of the second display panel.

13. The tiled display of claim 10, wherein the light output display surface has a rough structure.

14. The tiled display of claim 10, further comprising:
a light shading layer between the first side of the first display panel and the second side of the second display panel.

15. The tiled display of claim 10, wherein the first connecting electrode extends from a top surface of the first semiconductor layer to cover a sidewall of the first semiconductor layer.

16. The tiled display of claim 10, wherein each of the display panels further comprises:
a protective layer, wherein the first connecting electrode is disposed on the protective layer.

17. The tiled display of claim 15, wherein each of the display panels further comprises:
a protective layer, wherein the light emitting layer has a connecting surface connecting between the sidewall of the first semiconductor layer and the upper surface of the second semiconductor layer, and the protective layer is disposed on the connecting surface.

18. The tiled display of claim 17, wherein the protective layer extends from the top surface of the first semiconductor layer to cover the sidewall of the first semiconductor layer and the connecting surface.

19. The tiled display of claim 17, wherein the first connecting electrode is on the connecting surface.

* * * * *